United States Patent
Subramanian et al.

(10) Patent No.: US 7,289,193 B1
(45) Date of Patent: Oct. 30, 2007

(54) FRAME STRUCTURE FOR TURBULENCE CONTROL IN IMMERSION LITHOGRAPHY

(75) Inventors: Ramkumar Subramanian, Sunnyvale, CA (US); Bhanwar Singh, Morgan Hill, CA (US); Khoi A. Phan, San Jose, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 245 days.

(21) Appl. No.: 11/000,654

(22) Filed: Dec. 1, 2004

(51) Int. Cl.
*G03B 27/54* (2006.01)
*G03B 27/42* (2006.01)

(52) U.S. Cl. .......................................... 355/67; 355/53
(58) Field of Classification Search ................. 355/30, 355/53, 55, 67; 438/5, 7; 430/5, 30, 31
See application file for complete search history.

(56) References Cited

U.S. PATENT DOCUMENTS

| | | | |
|---|---|---|---|
| 5,610,683 A * | 3/1997 | Takahashi | 355/53 |
| 6,844,206 B1 * | 1/2005 | Phan et al. | 438/7 |
| 6,867,844 B2 * | 3/2005 | Vogel et al. | 355/30 |
| 7,006,209 B2 * | 2/2006 | Levinson | 356/128 |
| 2004/0227923 A1 * | 11/2004 | Flagello et al. | 355/71 |
| 2005/0175776 A1 * | 8/2005 | Streefkerk et al. | 427/256 |

* cited by examiner

*Primary Examiner*—Henry Hung Nguyen
(74) *Attorney, Agent, or Firm*—Amin, Turocy & Calvin, LLP (57) ABSTRACT

Disclosed are systems and methods that employ a structural framework of cell gratings placed on a wafer surface during an immersion lithography process to restrict motion of the immersion fluid. Thus, when the stepper lens comes in contact with the immersion fluid, a typically stable immersion fluid dynamics can be maintained with the cells during the immersion lithography process. In addition, various monitoring and control systems are employed to regulate stability of the immersion fluid.

20 Claims, 8 Drawing Sheets

SECTION A-A

Fig. 1(a)

SECTION A-A

FRAME STRUCTURE FOR TURBULENCE CONTROL IN IMMERSION LITHOGRAPHY

TECHNICAL FIELD

The subject invention generally relates to semiconductor processing and, more particularly, to systems and methods for mitigating turbulence of an immersion medium during an immersion lithography process.

BACKGROUND OF THE INVENTION

In the semiconductor industry, there is a continuing trend toward higher device densities. To achieve such densities fabrication of small feature sizes and more precise feature shapes are typically required. For example, this can include smaller width and spacing for: interconnecting lines, diameter of contact holes, and surface geometry, such as corners and edges. Accordingly, reducing the dimensions between such small features (critical dimensions—CDs) can facilitate achieving higher device densities.

High resolution lithographic processes can be used to achieve small features. In general, lithography refers to processes for pattern transfer between various media. In lithography for integrated circuit fabrication, a silicon slice, the wafer, is coated uniformly with a radiation-sensitive film, the photoresist. The film is selectively exposed with radiation (e.g., optical light, x-ray, electron beam, . . . ) through an intervening master template (e.g., mask, reticle, . . . ) forming a particular pattern (e.g., patterned resist). Dependent upon coating type, exposed areas of the coating become either more or less soluble than unexposed areas in a particular solvent developer. More soluble areas are removed with the developer in a developing step, while less soluble areas remain on the silicon wafer to form a patterned coating. The pattern corresponds to either the image of the mask or its negative. The patterned resist is used in further processing of the silicon wafer.

Efforts to reduce CDs have included implementing various techniques in connection with the lithographic process, such as reducing exposure radiation wavelength (e.g., from 436 nm mercury g-line to 365 nm i-line to 248 nm DUV to 193 nm excimer laser), improving optical design, utilizing metrology techniques (e.g., scatterometry, scanning electron microscope (SEM)), etc. Immersion lithography is another technique that facilitates further reduction of CDs.

In immersion lithography, a gap between a substrate (e.g., wafer) and a final optical component (e.g., lens, scanner, stepper, and the like) is filled with an immersion medium, which has a refractive index greater than the refractive index of air. Refractive index is defined as a ratio of speed of light in a vacuum to speed of light in a particular medium. Utilizing an immersion medium with a refractive index greater than that of air, which approximately equals 1, can increase numerical aperture, which is defined as a lens's ability to gather diffracted light and resolve fine details onto a wafer. Furthermore, utilization of an immersion medium can decrease an effective wavelength of an exposure radiation propagating within the immersion medium without changing exposure radiation, lasers, lens materials, and the like.

Typically in immersion lithography, turbulence from operation of the lens or the stepper can create bubbles in the immersion medium, change pressure of the immersion medium, and the like. The turbulence can adversely impact the photolithography procedure, for example by varying characteristics of the immersion medium (e.g., refractive index, photolithographic constant), varying an effective wavelength of exposure radiation propagating through the immersion medium employed in connection with immersion lithography, or reflect and/or deflect and/or refract the exposure radiation. Such, turbulence associated with the immersion medium can impact efficiency of immersion lithography systems and can elevate the costs associated with immersion lithographic processes.

Thus, there is a need to overcome the aforementioned deficiencies associated with conventional systems.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is merely to present some concepts of the invention in a simplified form as a prelude to the more detailed description that is presented later.

The subject invention provides systems and methods that mitigate turbulence of an immersion fluid by employing a structural framework of cell gratings placed on a wafer surface during the immersion lithography process. Each cell can accommodate shapes of a stepping pattern having a predetermined field size, which can be selected based on the wafer's circuit requirements for imprint on that portion of the wafer surface. As such, motion of the immersion fluid in each cell can be restricted to boundaries of such cell. Thus, when the stepper lens comes in contact with the immersion fluid, a typically stable immersion fluid dynamics can be maintained during the immersion lithography process.

In a related aspect of the subject invention, the structural framework can be selected during the immersion lithography process on the wafer surface based on the field size during each stepping pattern. Additionally, the plurality of cells as part of the structural framework can have a variety of configurations, such as cone shaped, cubicles, cylindrical, elliptical and the like. Such cells can be fabricated form quartz, various plastics, and in general any material that does not adversely react with the immersion fluid, and that at the same time maintains stable fluid dynamic conditions. Moreover, a plurality of sensors (e.g., immersion medium temperature sensors, viscosity and the like) can be embedded as part of the cell grid structure.

In addition, a bubble monitoring component that contains a detector component and a process control component can also be employed in conjunction with the grating structure, according to one aspect of the subject invention. The detector component can employ a light source that emits an incident beam that passes through the immersion medium and is incident upon the structural framework and/or another substrate to produce a reflected and/or diffracted beam(s). The detector component can additionally employ an optical detector that can receive reflected and/or diffracted light. As such, the presence or absence of bubbles can be derived from information extracted by scatterometry from the reflected and/or diffracted light. Moreover, such scatterometry results can produce an observed optical signature.

In a further aspect of the invention, simulation and modeling can be employed to determine expected optical signatures for the presence of bubbles at various locations within the immersion medium. A data store can be utilized to store a library of optical signatures. The system can then match observed optical signatures to the simulated and/or actual observed optical signatures stored in a library and thereby determines the location of any bubbles within the immersion medium.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings.

To facilitate the reading of the drawings, some of the drawings may not be drawn to scale from one figure to another or within a given figure.

DETAILED DESCRIPTION OF THE INVENTION

The subject invention is now described with reference to the drawings, wherein like reference numerals are used to refer to like elements throughout. In the following description, for purposes of explanation, numerous specific details are set forth in order to provide a thorough understanding of the subject invention. It may be evident, however, to one skilled in the art that one or more aspects of the subject invention may be practiced with a lesser degree of these specific details. In other instances, known structures and devices may be shown in block diagram form in order to facilitate describing one or more aspects of the subject invention.

As used in this application, the term "component" can also refer to a computer-related entity, either hardware, a combination of hardware and software, software, or software in execution. For example, a component can be, but is not limited to, a process running on a processor, a processor, an object, an executable, a thread of execution, a program, and a computer.

Figure 1A:
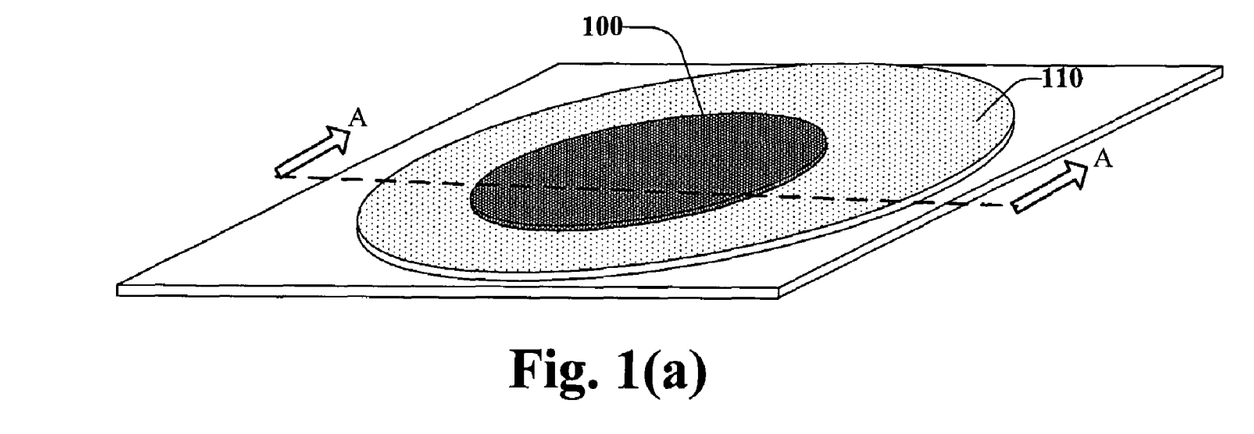
FIGS. 1(a) and 1(b) illustrate a schematic perspective of a wafer and an associated grating, which includes a plurality of cells in accordance with an aspect of the subject invention.

FIG. 1(a) illustrates a schematic perspective of a wafer surface upon which there is placed a grating comprising a plurality of cells in accordance with an aspect of the subject invention. The grating 100 can be placed over the wafer 110, and compartmentalize the immersion fluid to generally restrict its movement dynamics to the confines of each cell 130. As such, motion of the immersion fluid 135 in each cell 130 is restricted to boundaries of such cell. The immersion medium can occupy a gap between a substrate (not shown) and a final optical component (not shown) utilized in connection with photolithographic processing (e.g., lens, stepper, scanner, and the like). Various quantities of the immersion medium can be employed, such as a thin liquid film between the substrate and the final optical component, an entire wafer can be immersed within the immersion medium, a drop or a plurality of drops of the immersion medium can be employed, and the like, so long as the grating component can mitigate movement of the immersion fluid to reduce or eliminate turbulence.

Moreover, characteristics of the immersion medium 135 can include low optical absorption at the exposure radiation wavelength, compatibility with resist and lens material, uniformity of properties throughout the immersion medium 135, non-contaminating, and the like. The immersion medium 135 can be, for example, water, oil (e.g., perfluorinated polyethers (PFPE) including PFPE-K, PFPE-Y, PFPE-D, PFPE-M, PFPE-Z), and the like. The immersion medium utilized in connection with the subject invention typically has a refractive index greater than the refractive index of air. For example, the refractive index corresponding to about 193 nm radiation is approximately 1.4 for water and approximately 1 for air.

By employing the grating 100 in accordance with an aspect of the subject invention, when the stepper lens (not shown) comes in contact with the immersion fluid 135, a typically stable immersion fluid dynamics can be maintained during the immersion lithography process. The grating 100 can be fabricated from alumina, quartz, ceramic, plastic composites, and in general any material that does not adversely react with the immersion fluid (e.g., chemically reacting with immersion fluid and creating bubbles therein), and that can absorb mechanical stress of the immersion lithographic process without failing or substantial strain.

Figure 1B:
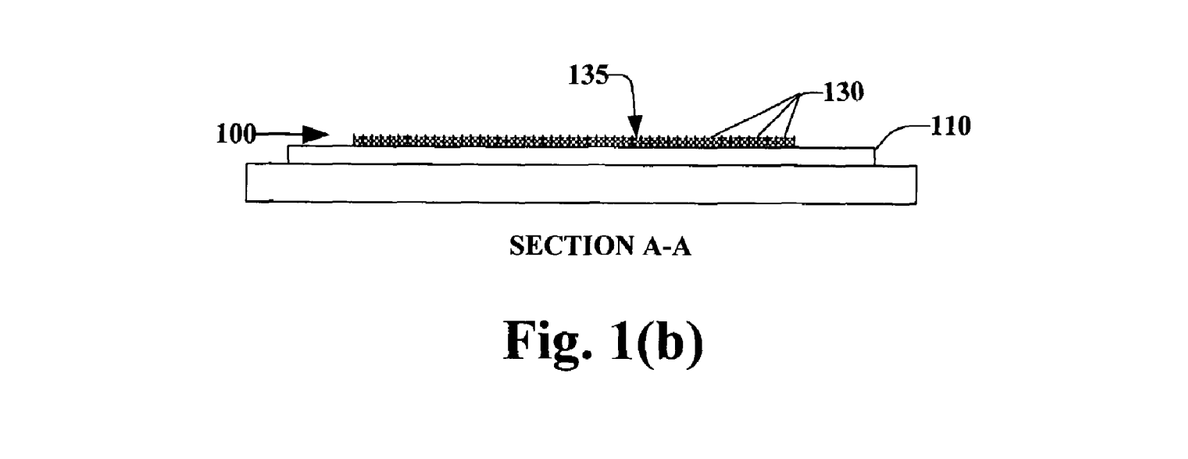

FIG. 1(b) illustrates a side view of the grating 100 with a plurality of cells 130 placed on the wafer 110 surface. Each of the cells 130 can accommodate a shape of a stepping pattern having a particular field size, which can be selected based on circuit design requirements for imprint on that portion of the wafer surface. Attached to the grating 100 can be a plurality of sensor device(s) (not shown) that can measure a plurality of properties associated with the immersion lithography process. Such properties can for example, include temperature, viscosity, pressure, liquid current flow, density, and the like. Such information can then be processed via a control mechanism as described in more detail infra to control the operation of the lithography process. The grating 100 can be customized for the wafer surface 110 depending on the field size during each stepping pattern. Additionally, the plurality of cells as part of the structural framework of the grating 100 can have a variety of configurations, such as cone shaped, cubicles, cylindrical, elliptical and the like.

Figure 2A:
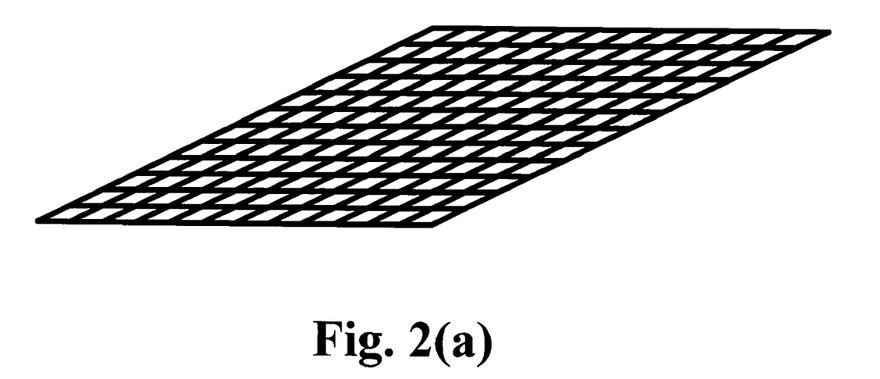
FIGS. 2(a) and 2(b) illustrate a perspective view of a grating and various cross sectional configurations of individual cell compartments in accordance with an aspect of the subject invention.
Figure 2B:
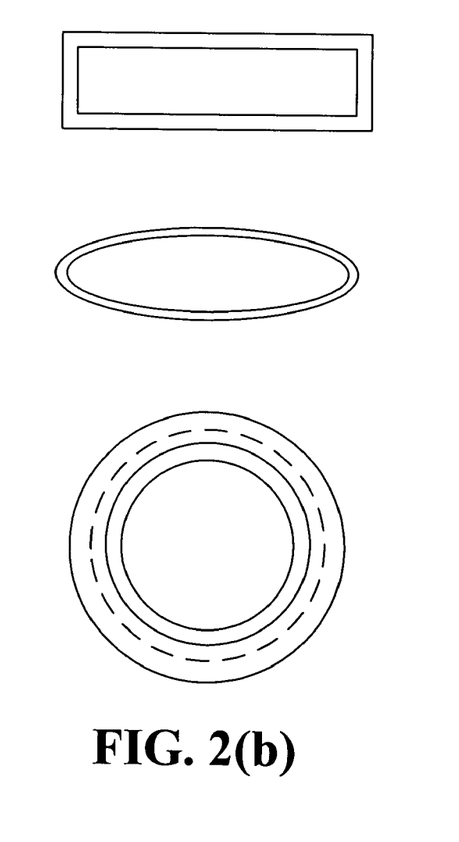

FIG. 2(a) illustrates a perspective view of a grating in accordance with an aspect of the subject invention. It is to be appreciated that the grating can have various other configurations, in addition to parallel walls as shown in FIG. 2(a). Moreover, as illustrated in FIG. 2(b) various configurations can form the cross sections of the grating of the subject invention. The cell cross section can remain constant throughout the height of the grating 100, or can vary, e.g., as a cone like structure with different cross sections throughout as depicted in FIG. 2(b). It is to be appreciated that the grating structure can also be non-uniform, with different cell configurations for different locations on the wafer surface. Moreover, each cell can accommodate a shape of a stepping pattern having a predetermined field size based on circuit design requirements, which can be customized for imprint on that particular portion of the wafer surface.

Figure 3:
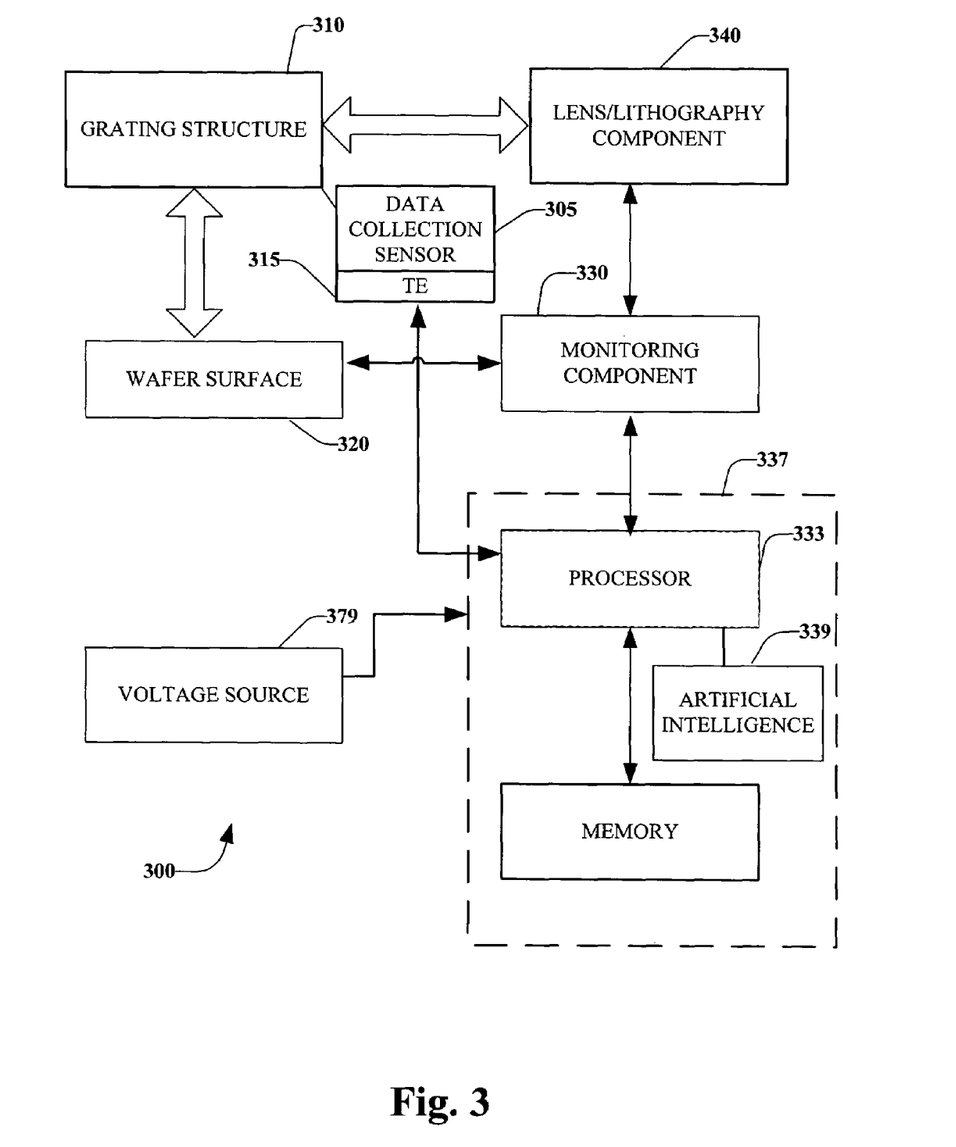
FIG. 3 illustrates a block diagram of an immersion lithography system according to an exemplary aspect of the subject invention.

FIG. 3 illustrates a block diagram for an immersion lithography system 300 in accordance with an aspect of the subject invention. The system 300 includes a grating structure 310 that is positioned over a wafer surface 320. The grating structure 310 comprises a plurality of cells that can compartmentalize the immersion fluid to generally restrict its movement dynamics to the confines of each cell, and thus reduce bubble creation within the space confined by a cell. A lithographic optical apparatus 340 can then operate on the wafer surface 320 via the grating structure 310. A monitoring component 330 can monitor bubble formation in the immersion medium and is operatively connected to various parameter data gathering sensors 305, including a temperature collection component 315. Typically contact of the lithographic optical apparatus 340 with the immersion medium can cause turbulence resulting in the formation of bubbles that can adversely affect the immersion lithography process.

A processor 333 can be part of a control unit 337 that has the ability to sense or display information, or convert analog information into digital, or perform mathematical manipulation of digital data, or interpret the result of mathematical manipulation, or make decisions on the basis of the information. As such, the control unit 337 can be logic unit, a computer or any other intelligent device capable of making decisions based on the data gathered and provided to it by the monitoring component 330. The processor 333 can analyze collected data relating to the stability of the immersion medium and output control signals to control the general operation of the lithograph opticals, or induce corrective measures in the form of effectuating changes in refractive index and/or lithographic constant of the immersion medium by means of varying temperature, pressure, flushing the immersion medium, and the like, to counter act the adverse affect of bubble formation.

The bubble monitoring component 330 can also provide the control unit 337 with data gathered continuously about various physical properties of the different regions of the wafer surface, such as, topography, contours, erosion rate, and the like. In addition, a suitable power supply 379 provides operating power to the control unit 337.

In addition various artificial intelligence component(s) 339 can be employed in conjunction with inferring the stability of the immersion medium and amount of bubble formation. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

The Bubble monitoring component 330 can also be operatively connected to the optical component 340. If bubble monitoring component 330 detects the presence of bubbles, the bubble monitoring component 330 can inhibit or otherwise affect the lithographic exposure of substrate 320 by optical component 340 via for example temperature correction of the grating structure 310, cell's pressure change, flushing the immersion medium, and the like, to counter act the adverse affect of bubble formation.

If the bubble monitoring component 330 does not detect the presence of bubbles, then the lithographic exposure may proceed as programmed. It is to be appreciated that bubble monitoring component 330 can comprise, for example, a scatterometry component (not shown). The subject invention contemplates any suitable bubble monitoring component 330 and/or system, and such components and/or systems are intended to fall within the scope of the hereto-appended claims.

The subject invention (e.g., in connection with stabilizing region(s) on the wafer surface via the grating component 310) can employ various artificial intelligence based schemes for carrying out various aspects thereof. For example, a process for determining temperature and pressures variances for different cells of the grating can be facilitated via an automatic classification system and process. Such classification can employ a probabilistic and/or statistical-based analysis (e.g., factoring into the analysis utilities and costs) to prognose or infer an action that is desired to be automatically performed. For example, a support vector machine (SVM) classifier can be employed. A classifier is a function that maps an input attribute vector, x=(x1, x2, x3, x4, xn), to a confidence that the input belongs to a class—that is, f(x)=confidence(class). Other classification approaches include Bayesian networks, decision trees, and probabilistic classification models providing different patterns of independence can be employed. Classification as used herein also is inclusive of statistical regression that is utilized to develop models of priority. As will be readily appreciated from the subject specification, the subject invention can employ classifiers that are explicitly trained (e.g., via a generic training data) as well as implicitly trained (e.g., via observing system behavior, receiving extrinsic information) so that the classifier(s) is used to automatically determine according to a predefined criteria which regions to choose. For example, with respect to SVM's it is to be appreciated that other classifier models may also be utilized such as Naive Bayes, Bayes Net, decision tree and other learning models—SVM's are configured via a learning or training phase within a classifier constructor and feature selection module.

As explained earlier, the grating structure 310 can include a plurality of data acquiring components 305 associated therewith, such as an immersion medium temperature sensor 315. The immersion medium temperature sensor 315 can employ contact and/or non contact temperature measurement techniques, and can operate based on analog and/or a digital principles. Furthermore, the immersion medium temperature sensor 315 can be a thermocouple, a resistive temperature device (RTD), a thermistor, an infrared radiator, a bimetallic device, a liquid expansion device, a change of state device, and the like.

For example, the immersion medium temperature sensor 315 can be an infrared temperature sensor that employs a non contact temperature measurement technique. The infrared temperature sensor can absorb ambient infrared radiation emitted from the immersion medium surface. The received electromagnetic information can be converted to an electrical signal related to the temperature; thus, the infrared temperature sensor(s) can be positioned at a distance and at various angles from the immersion medium while monitoring the temperature(s). Moreover, the immersion medium temperature sensor 315 can be a thermocouple that includes multiple wires (e.g., two wires), where each is a disparate material. The two wires can be connected at one end to form a measuring junction, which is the location where a temperature measurement of the immersion medium is taken. The two wires additionally can form a reference junction at a measuring instrument. Temperature differences between the measuring junction and the reference junction can yield a current flow that can be evaluated to determine the temperature. The immersion medium temperature sensor 315 can also be a thermistor that utilizes a metal oxide ceramic base element, which typically exhibits a large change (e.g., linear or nonlinear) in resistance proportional to a small change in temperature. Two thermistor elements can be employed in combination to reduce non-linear temperature responses. According to an aspect, the immersion medium temperature sensor 315 can be a fiber optic temperature sensor that typically includes a thin film formed of gallium arsenide on the end of the fiber. The temperature is determined via the fiber optic sensor by evaluating the reflected absorption/transmission spectrum. The subject invention, however, is not limited to the aforementioned exemplary devices and/or techniques that can be utilized as the immersion medium temperature sensor 315.

Figure 4:
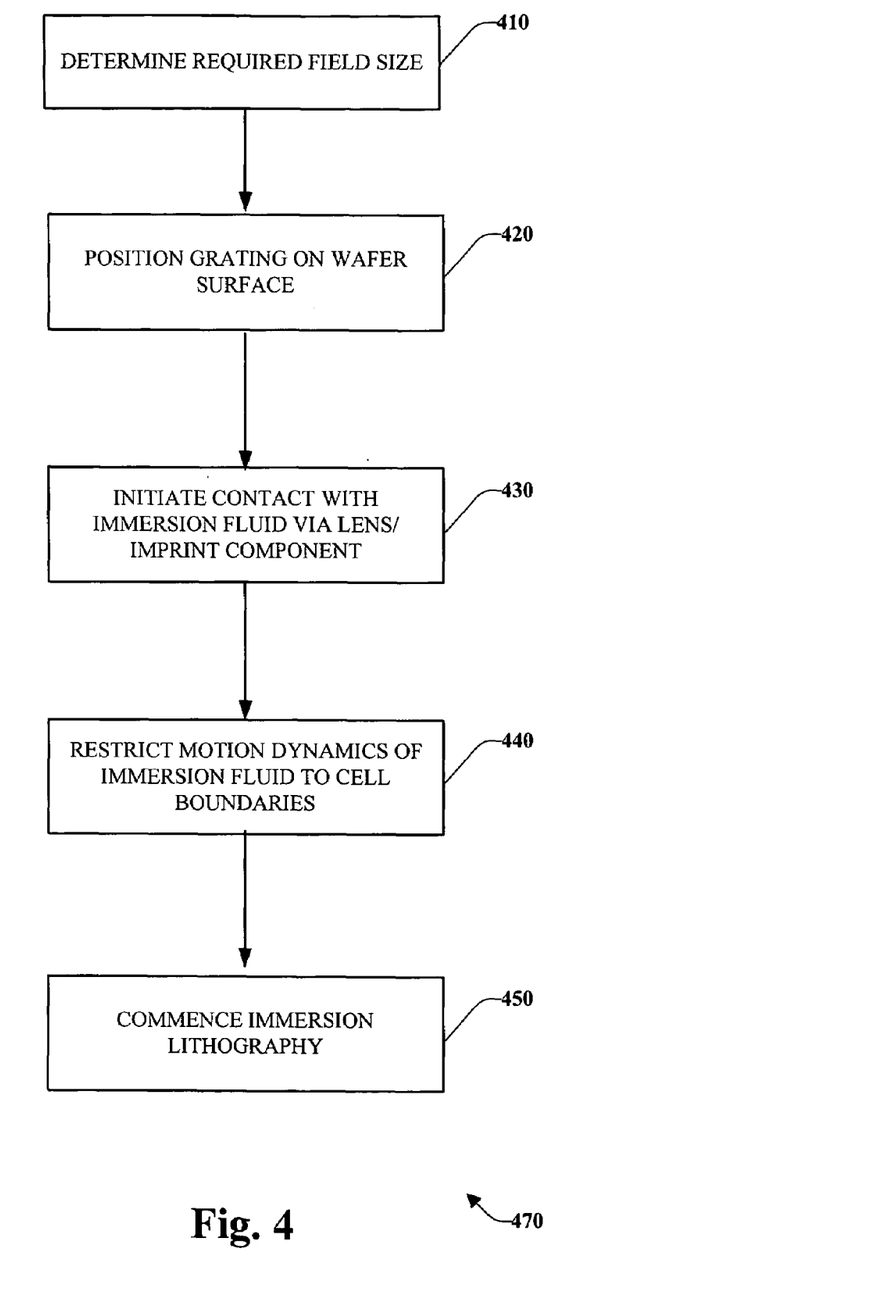
FIG. 4 illustrates a flow chart for a methodology according to one aspect of the subject invention.

FIG. 4 illustrates a methodology according to one aspect of the subject invention. At 410, a stepping pattern having a predetermined range of fields based on circuit requirements of the wafer, can then be selected for the immersion lithography process. Such predetermined range can vary for various portions of the wafer to be imprinted. Next, and at 420 a grating structure having a plurality of cells therein can be placed between the wafer to be processed and the stepping lens within the immersion fluid. Such grating structure can restrict a motion of the immersion fluid in each cell to boundaries of such cell. Next, and at 430 the stepper lens comes into contact with the immersion fluid for the imprint process. This inward (and outward) motion of the stepper lens can typically induce turbulence and form bubbles, which can adversely affect the imprint process. The subject invention at 440 can then reduce the turbulence by restricting dynamics of fluid movement for the immersion fluid to the cell boundaries, and thus reducing turbulence formation, for commencement of immersion lithography at 450.

While the exemplary method is illustrated and described herein as a series of blocks representative of various events and/or acts, the subject invention is not limited by the illustrated ordering of such blocks. For instance, some acts or events may occur in different orders and/or concurrently with other acts or events, apart from the ordering illustrated herein, in accordance with the invention. In addition, not all illustrated blocks, events or acts, may be required to implement a methodology in accordance with the subject invention. Moreover, it will be appreciated that the exemplary method and other methods according to the invention may be implemented in association with the method illustrated and described herein, as well as in association with other systems and apparatus not illustrated or described.

Figure 5:
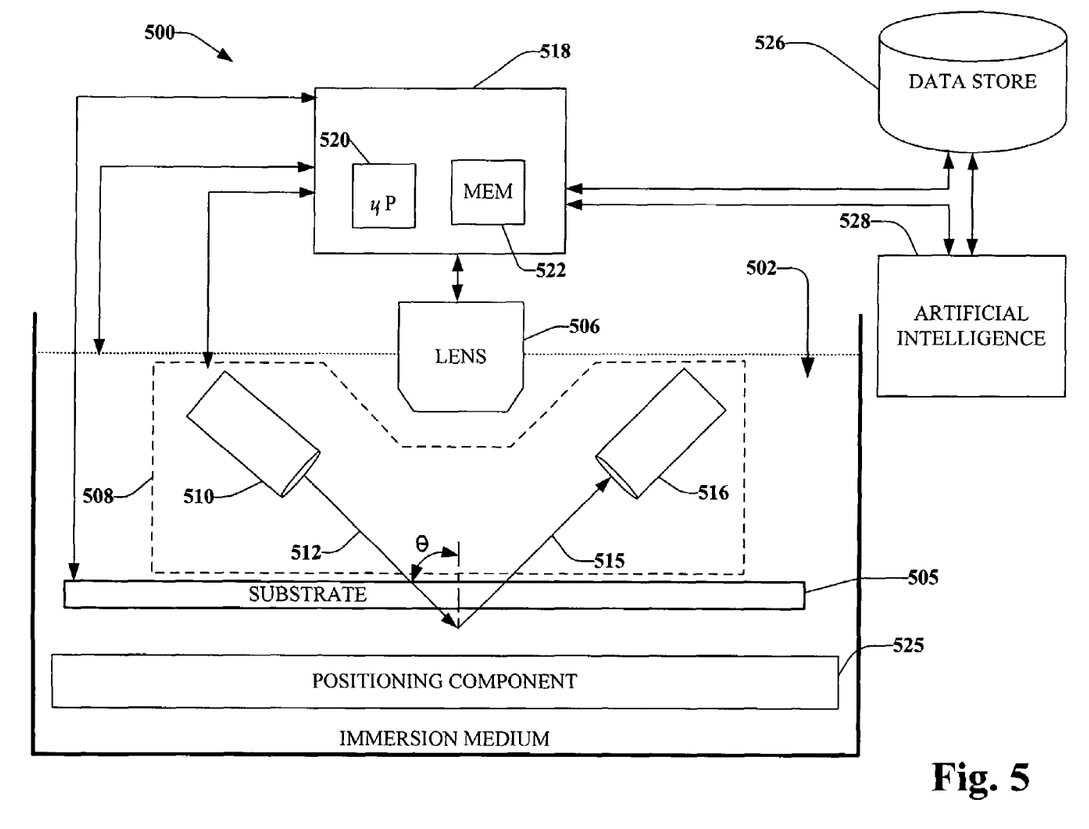
FIG. 5 illustrates an example of a control system that detects bubbles in a lithographic immersion medium in accordance with an aspect of the subject invention.

FIG. 5 illustrates an example of another system, 500, for detecting bubbles in a lithographic immersion medium 502 and for controlling a lithographic process based at least in part on the detection of bubbles in accordance with an aspect of the subject invention. As part of system 500, a substrate 505 with a known structure is located within immersion medium 502. An optical component, such as a lens 506, is also at least partially within immersion medium 502. In accordance with an aspect of the subject invention, system 500 utilizes detector component 508 for detecting bubbles within immersion medium 502. Detector component 508 is a non-destructive component that includes a light source 510 and a light detector 516. By way of illustration, light source 510 can be one or more optical emitters that emit an incident light beam 512 toward substrate 505 at an incident angle θ relative to a normal reference line. Light source 510 is a frequency stabilized laser; however it is understood that any suitable light source (e.g., laser diode, helium neon (HeNe) gas laser, halogen lamp, UV light sources, E-UV light sources, etc.) can be utilized in connection with the subject invention. At least a portion of incident beam 512 can be reflected and/or diffracted from the surface of substrate 505 and/or from bubbles within the immersion medium as a reflected beam 515. One or more optical detectors 516 can then receive the reflected and/or diffracted beam 515.

The system 500 further comprises a process control component 518. Process control component 518 is operative to change the configuration of detector component 508 so as to evaluate the entire volume, or alternatively a selected portion of the entire volume of immersion medium 502. For example, such configuration change can include changing the direction of light source 510 such that light is emitted in a different direction and by making a corresponding change, if necessary, in the alignment of detectors 516 for detection of reflected and/or diffracted light. The process of configuration changes followed by evaluation is repeated until the entire desired volume of the immersion medium has been evaluated.

Optical detector(s) 516 are operative to analyze characteristics of the reflected beam 515 and are operative to discern characteristics of light reaching the optical detectors. As described below, the light reaching the optical detectors contains information about the immersion medium through which the light has traveled and about the substrate from which the light is reflected and/or refracted. By way of example, optical detector 516 includes a spectrometer or other instrument capable of providing spectrally-resolved information regarding reflected beam 515. The portion of the reflected and/or diffracted beam 515 that enters optical detector 516 for analysis is determined at least in part by the reflection/diffraction characteristics of the immersion medium and the known wafer structure along with properties of optical detector 516 and any associated optical elements used in conjunction with optical detector 516.

Optical detector 516 collects light passing through immersion medium 502 that is reflected and/or diffracted by features on substrate 505. Optical detector 516 also collects light which reflects and/or diffracts off bubbles within the immersion medium before entering the optical detector. Bubble monitoring component 508 can determine the presence of bubbles in the immersion medium 502 by comparing characteristics such as wavelength, phase and/or intensity of the light received at various locations within optical detector 516 to set of reference characteristics determined when bubbles were not present in the immersion medium. The location at which the reflected and/or diffracted light is received along with the wavelength, intensity and/or phase of the reflected and/or diffracted light received at optical detector 516 changes based on the presence or absence of bubbles within immersion medium 502.

Process control component 518 further comprises a processor 520 and memory 522. Memory 522 stores program code executed by processor 520 for carrying out operating functions of the system. Memory 522 also serves as a storage medium for temporarily storing information from system 500. Memory 522 can be volatile memory or nonvolatile memory, or can comprise both volatile and nonvolatile memory. By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory of the present systems and methods is intended to comprise, without being limited to, these and any other suitable types of memory.

In accordance with one aspect of the subject invention, process control component 518 can facilitate operation of an immersion lithographic process. According to this aspect of the subject invention, process control component 518 can be operatively connected to immersion medium 502, lens 506, bubble monitoring component 508, positioning component 525, a data store component 526, and a artificial intelligence component 528. Process control component 518 can effectuate changes in an immersion lithographic process such as, for example, a delay in starting an exposure through lens 506, a repositioning of substrate 505, a replacement of immersion medium 502, and the like, based at least in part upon information obtained from bubble monitoring system 508.

By comparing location and characteristics of light received by optical detector 516 to acceptable locations and reference characteristics stored in either RAM or data store 526, system 500 can determine whether the immersion medium contains bubbles which will interfere with the exposure of substrate 505. Process control component 518, in conjunction with artificial intelligence component 528, can employ the results of the comparison to determine a next appropriate action. For example, it can be determined that more time is required, or a grating structure with a different size is required, for bubbles to dissipate before allowing the exposure of substrate 505 to lens 506, or that positioning system 525 needs to reposition substrate 505 to a new location prior to exposure from lens 506, or that immersion fluid 502 needs to be replaced prior to proceeding with a next step in an immersion lithographic process.

In accordance with another aspect of the subject invention, the presence or absence of bubbles within an immersion fluid can be determined utilizing scatterometry techniques. Scatterometry is a technique for extracting information about a surface upon which an incident light has been directed. Information concerning properties including, but not limited to, dishing, erosion, profile, chemical composition, thickness of thin films and critical dimensions of features present on a surface such as a substrate can be extracted. Furthermore, information about an immersion medium through which light is transmitted can be extracted by utilizing scatterometry techniques. The intensity and/or the phase of a reflected and/or diffracted beam of light will change based on properties of the surface upon which the light is directed and the immersion medium through which the light travels. Information can be extracted by evaluating the wavelength, phase and/or intensity of light received at various locations of a detector. In accordance with one aspect of the subject invention, the presence of bubbles within an immersion fluid can be determined utilizing scatterometry techniques.

Figure 6:
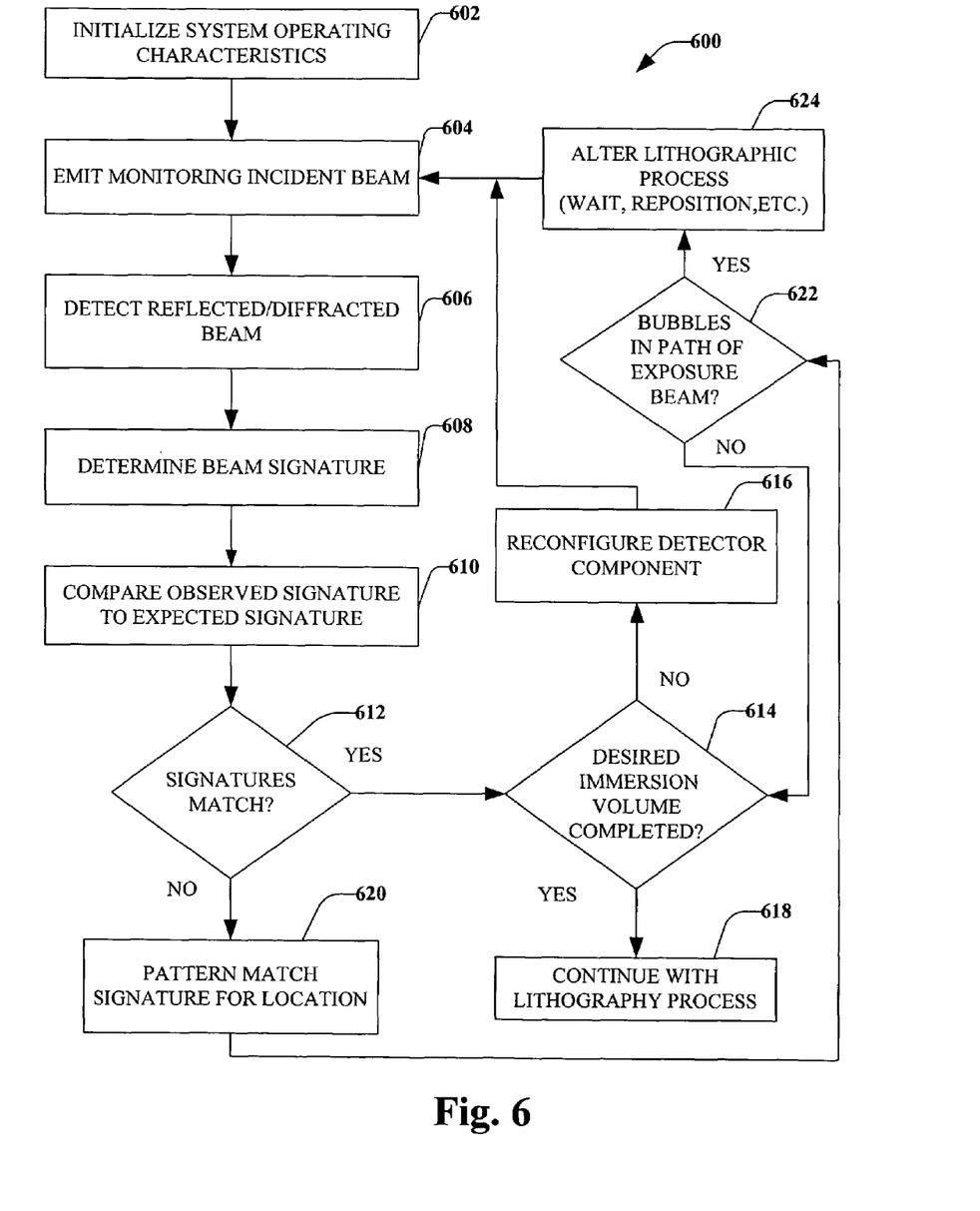
FIG. 6 is a flow diagram illustrating a methodology for carrying out another aspect of the subject invention.

FIG. 6 is a flow diagram illustrating a methodology for carrying out another aspect of the subject invention. The methodology 600 provides a method for determining the location of bubbles in an immersion medium within a grating structure of the subject invention, and then selecting an alternative action, based at least in part, upon the location of bubbles within the grating structure. Turning now to FIG. 6, a methodology 600 begins by initializing the system operating characteristics to their starting values at 602. This can include, for example, positioning a substrate with a known structure into an immersion medium at the proper location for exposure from a lithographic optical component and/or setting initial parameters of an incident beam for monitoring the immersion medium in accordance with an aspect of the subject invention. In accordance with another aspect of the subject invention, a set of expected optical signatures corresponding to the known structures at known spots on the substrate for the immersion medium under desired conditions where no bubbles are present can be made available in a data store or other suitable memory. Similarly, a library of optical signatures corresponding to the presence of one or more bubbles at one or more locations for a particular spot on a particular substrate in a particular medium is made available in a data store or other suitable memory.

At 604, an incident beam is emitted from a light source of the bubble monitoring system. The emitted incident beam travels through the immersion medium toward a substrate so as to be incident on a known spot on the substrate at a known incident angle to a normal. At 606, reflected and/or diffracted beam(s) produced from the incident beam interacting with the substrate and with bubbles within the immersion medium are detected. The reflected and/or diffracted beam(s) can be received by one or more optical detectors comprising spectrometers or other optical detection devices capable of determining properties of the reflected and/or diffracted beam(s). The reflected and/or diffracted beam(s) contains information indicative of the immersion medium traversed and of the structure of the substrate from which the beams are reflected and/or diffracted. This information can be analyzed to determine the presence of bubbles within the immersion medium.

At 608, the information contained in the reflected and/or diffracted beam(s) can be analyzed to determine optical properties and characteristics of the reflected and/or diffracted beam(s). The optical properties and characteristics can include, for example, wavelength, intensity, and phase of light received at various locations on the detectors. The combination of these optical characteristic and locations can be employed to generate an observed optical signature.

An expected optical signature, reflective of an acceptable immersion medium where no bubbles are present, is available in memory or a data store from initialization. Such optical signature can be obtained through direct observation or through simulation and modeling. At 610, the methodology continues and the observed optical signature of the reflected and/or diffracted beam(s) is pattern matched against the expected optical signature.

At 612 a determination is made as to whether bubbles have been detected based upon whether or not the observed optical signature matches the expected optical signature. If at 612 it is determined that no bubbles exist (the observed signature matches the expected signature), the methodology continues on to 614. At 614, it is determined whether the desired volume of the immersion medium has been completely evaluated or not. If the entire volume of the immersion medium has not been completely evaluated, then at 616, the detector component is reconfigured by the process control component to evaluate a different portion of the immersion medium. Such reconfiguration may comprise, for example, repositioning the light source to emit a beam at a different incident angle so as to cover a different portion of the immersion medium by traversing a different path through the immersion medium and realigning, if necessary, the optical detectors to receive reflected and/or diffracted beam(s). Upon completion of the reconfiguration of the detector component, the methodology returns to 604 where an incident beam is again emitted from the reconfigured detector component. If, however, at 614, if it is determined that the entire desired volume of the immersion medium has been evaluated, then at 618 the lithographic process continues as planned.

Returning to 612, if it is determined that bubbles are present in the immersion medium (e.g., the observed signature does not match the expected signature), then the methodology continues at 620 where the observed signature is pattern matched against a library of signatures corresponding to the presence or absence of one or more bubbles at various locations within the immersion medium for the known structure at the particular spot on the particular substrate. Based on the results of the pattern match, a determination is made at 622 as to whether the bubbles are located within an exposure beam path traversed by an exposure beam from the optical component (e.g. lens) to the substrate.

Likewise, if at 622, it is determined based upon a pattern match that the bubbles do not lay within the exposure beam path, then the methodology proceeds to 614 and continues as described above. If, on the other hand, at 622 it is determined based upon a pattern match that the bubbles do lay within the exposure beam path, then at 624 the process control system alters the lithographic process. Alteration of the lithographic process can include waiting a fixed period of time, repositioning a substrate, changing the immersion medium, change of grating size and the like, which can be selected based upon the particular location of bubbles identified through the pattern match process. After completion of the alteration, the methodology returns to 604 and continues. If no pattern is matched at 622, it is determined that an unidentified condition of bubbles being present exists and the immersion lithographic process should not proceed without some type of corrective action, accordingly the methodology proceeds to 624 and proceeds as described above.

Although methodology 600 illustrated determining whether bubbles exist within a particular exposure path within the immersion medium, it is understood that the methodology can be applied to determine the presence of bubbles at any desired location of interest within the immersion medium.

Figures 7, 8, 9:
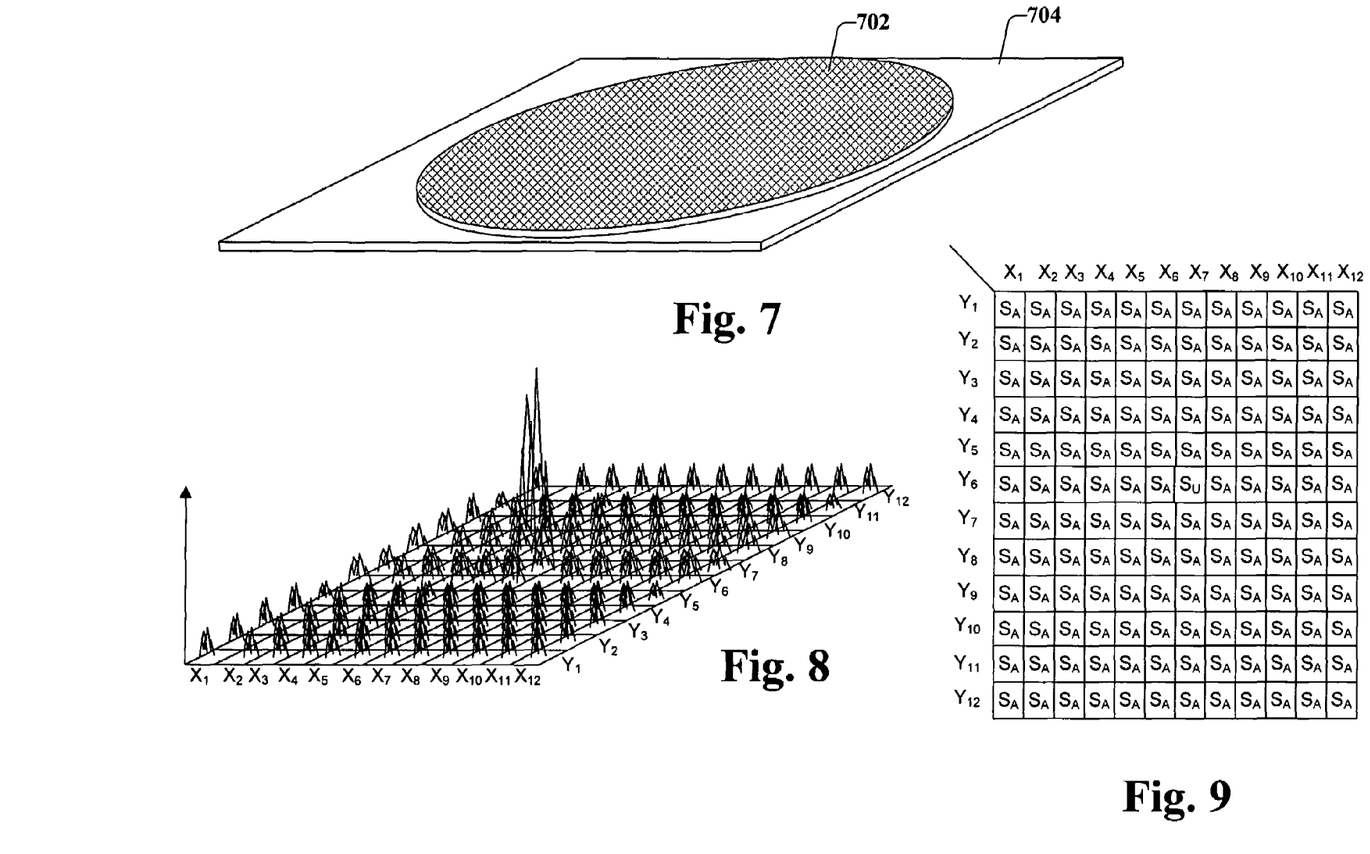
FIG. 7 illustrates a perspective view of a grid-mapped wafer corresponding to portions of an immersion medium constrained by the grating according to one or more aspects of the subject invention.
FIG. 8 illustrates plots of measurements taken at grid-mapped locations of the immersion medium in accordance with one or more aspects of the subject invention.
FIG. 9 illustrates a table containing entries corresponding to measurements taken at respective grid-mapped locations of the immersion medium in accordance with one or more aspects of the subject invention.

In accordance with one or more aspects of the subject invention, FIG. 7 illustrates how a substrate 702 can be logically partitioned for purposes of examining an immersion medium to correspond with a grid structure positioned on a wafer surface, in accordance with the subject invention. In FIG. 7, substrate 702, situated on a stage 704, can be logically partitioned into crisscross blocks that can correspond to a grating structure of the subject invention. Each grid block (XY) of the grid pattern can correspond to a particular portion of substrate 702 to be exposed in a lithographic process. The structure associated each grid block can be a known structure with a defined grating field. The immersion medium can be evaluated separately before lithographic exposure of each grid block portion of substrate 702 and a corresponding signature can be determined and evaluated for each grid location (e.g., spot on the wafer surface).

In FIG. 8, one or more portions of the immersion medium in proximity to respective portions of substrate grid blocks ($X_1Y_1 \ldots X_{12}, Y_{12}$) are evaluated by a bubble monitoring system for signatures using reflected and/or diffracted light and the illustrated known substrate structures. It is to be appreciated that although FIG. 8 illustrates a substrate partitioned into 144 grid block portions, the substrate may be partitioned into any suitable number of portions. Given a set of expected signatures, a bubble monitoring system can determine if bubbles exist near any of the substrate grid block locations. Similarly, the bubble monitoring system may generate feed forward information which, as described in detail supra can facilitate maintaining, terminating, and/or altering an immersion lithographic process based at least in part on the observed signatures.

FIG. 9 illustrates a table 900 recorded with results from comparing an observed signature to an expected signature for the individual grid block locations. In table 900, $S_E$ indicates that the observed signature matched the expected signature and $S_U$ indicates that the observed signature was unexpected and did not match the expected signature for the given grid block location. It can be seen that all the signatures are expected except a signature for grid block location $X_7Y_6$. The table of results can be analyzed for the presence or absence of bubbles in specific grid block locations.

Figure 10:
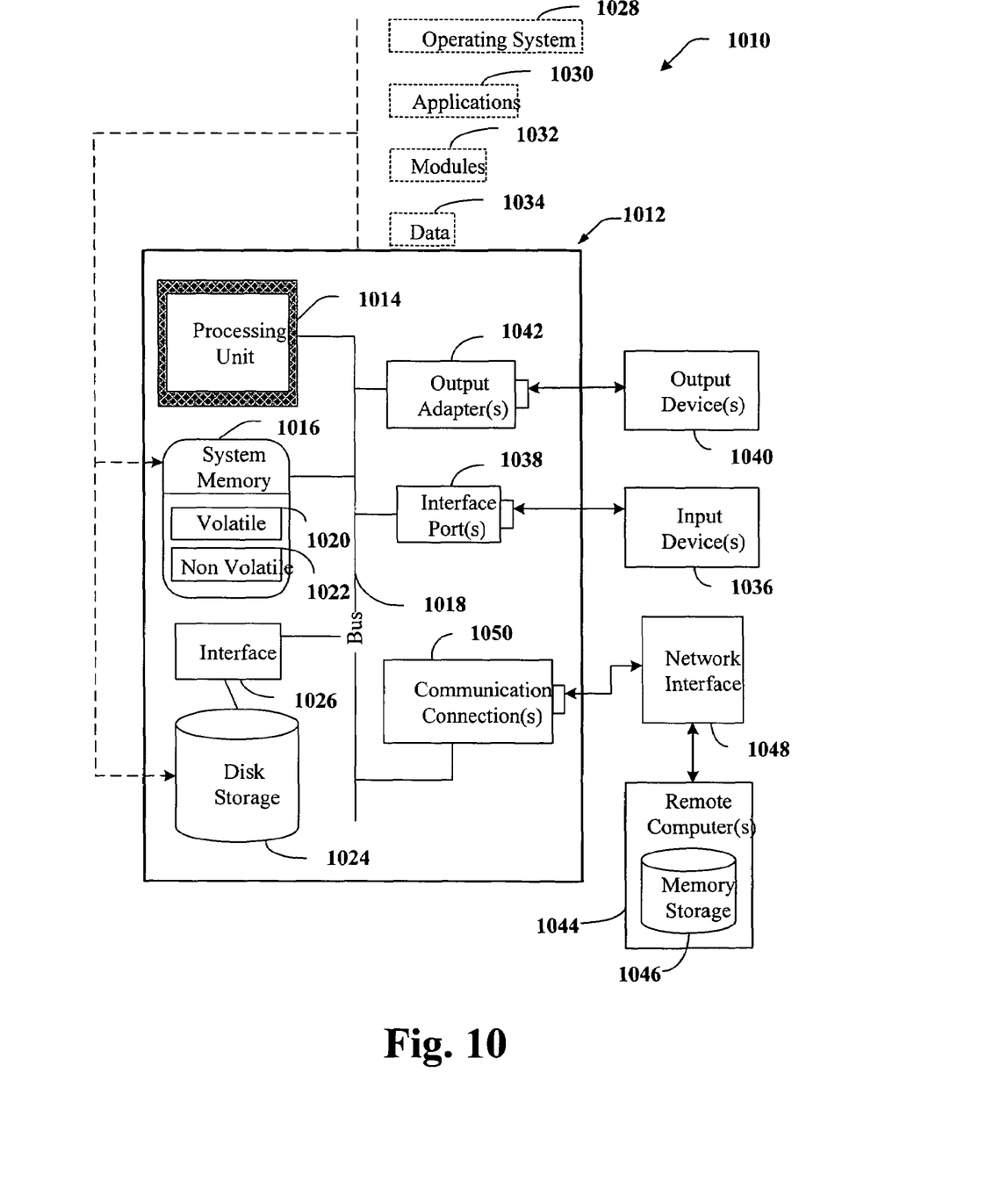
FIG. 10 is an illustration of an exemplary computing system and/or environment in connection with facilitating employment of the subject invention.

In order to provide additional context for various aspects of the subject invention, FIG. 10 and the following discussion are intended to provide a brief, general description of a suitable computing environment 1010 in which the various aspects of the subject invention can be implemented. While the control/monitoring systems of the invention has been described above in the general context of computer-executable instructions that may run on one or more computers, those skilled in the art will recognize that the invention also may be implemented in combination with other program modules and/or as a combination of hardware and software. Generally, program modules include routines, programs, components, data structures, and the like that perform particular tasks or implement particular abstract data types. Moreover, those skilled in the art will appreciate that the inventive methods may be practiced with other computer system configurations, including single-processor or multi-processor computer systems, minicomputers, mainframe computers, as well as personal computers, hand-held computing devices, microprocessor-based or programmable consumer electronics, and the like, each of which may be operatively coupled to one or more associated devices. The illustrated aspects of the invention may also be practiced in distributed computing environments where certain tasks are performed by remote processing devices that are linked through a communications network. In a distributed computing environment, program modules may be located in both local and remote memory storage devices.

With reference to FIG. 10, an exemplary environment 1010 for implementing various aspects of the invention includes a computer 1012. The computer 1012 includes a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014.

The system bus 1018 can be any of several types of bus structure(s) including the memory bus or memory controller, a peripheral bus or external bus, and/or a local bus using any variety of available bus architectures including, but not limited to, an 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1016 includes volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include read only memory (ROM), programmable ROM (PROM), electrically programmable ROM (EPROM), electrically erasable ROM (EEPROM), or flash memory. Volatile memory 1020 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1012 also includes removable/nonremovable, volatile/nonvolatile computer storage media. FIG. 10 illustrates, for example a disk storage 1024. Disk storage 1024 includes, but is not limited to, devices like a magnetic disk drive, floppy disk drive, tape drive, Jaz drive, Zip drive, LS-100 drive, flash memory card, or memory stick. In addition, disk storage 1024 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1024 to the system bus 1018, a removable or non-removable interface is typically used such as interface 1026.

It is to be appreciated that FIG. 10 describes software that acts as an intermediary between users and the basic computer resources described in suitable operating environment 1010. Such software includes an operating system 1028. Operating system 1028, which can be stored on disk storage 1024, acts to control and allocate resources of the computer system 1012. System applications 1030 take advantage of the management of resources by operating system 1028 through program modules 1032 and program data 1034 stored either in system memory 1016 or on disk storage 1024. It is to be appreciated that the subject invention can be implemented with various operating systems or combinations of operating systems.

A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port may be used to provide input to computer 1012, and to output information from computer 1012 to an output device 1040. Output adapter 1042 is provided to illustrate that there are some output devices 1040 like monitors, speakers, and printers among other output devices 1040 that require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a personal computer, a server, a router, a network PC, a workstation, a microprocessor based appliance, a peer device or other common network node and the like, and typically includes many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1050 refers to the hardware/software employed to connect the network interface 1048 to the bus 1018. While communication connection 1550 is shown for illustrative clarity inside computer 1012, it can also be external to computer 1012. The hardware/software necessary for connection to the network interface 1048 includes, for exemplary purposes only, internal and external technologies such as, modems including regular telephone grade modems, cable modems and DSL modems, ISDN adapters, and Ethernet cards.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system for mitigating immersion medium turbulence in semiconductor fabrication, comprising:
a grating with a plurality of cell structures that compartmentalize an immersion medium to boundaries of the cell structures and mitigate turbulence of the immersion medium, the grating placed over a wafer surface that undergoes an immersion lithography process, each cell structure accommodating a shape of a stepping pattern having a predetermined field size based on circuit design requirements for the wafer.

2. The system of claim 1, wherein a cell of the grating has a variable cross section through out a thickness of the grating.

3. The system of claim 1, further comprising a sensor component that collects data associated with the immersion medium.

4. The system of claim 3, wherein the sensor component is at least one of a thermocouple, a resistive temperature device, a thermistor, an infrared radiator, a bimetallic device, and a liquid expansion device.

5. The system of claim 3, further comprising a control component that regulates the immersion lithography process in response to data collected via the sensor component.

6. The system of claim 5, wherein the control component further comprises an artificial intelligence unit to infer a stability of the immersion medium.

7. The system of claim 1, wherein the grating comprises a material selected from the group consisting of quartz, plastic, and metal.

8. The system of claim 1, further comprising a monitoring component that monitors formation of bubbles in the immersion medium.

9. The system of claim 8, wherein the monitoring component is a scatterometry system.

10. A method of turbulence reduction in immersion lithography comprising:
providing an immersion fluid between a wafer and a stepper optical component; and
restricting motion dynamics of the immersion fluid via a grating positioned over the wafer by compartmentalizing the immersion fluid to boundaries of cell structures of the grating and mitigating movement and turbulence of the immersion fluid, each cell structure accommodating a shape of a stepping pattern having a predetermined field size based on circuit design requirements for the wafer.

11. The method of claim 10 further comprising monitoring data associated with the immersion fluid placed between the wafer and the stepper optical component.

12. The method of claim 10 further comprising controlling a turbulence of the immersion fluid within the grating via an immersion flushing.

13. The method of claim 10 further comprising controlling a turbulence of the immersion fluid within the grating via varying a temperature of the immersion fluid.

14. The method of claim 10 further comprising monitoring formation of bubbles in a cell of the grating.

15. The method of claim 14 further comprising employing a scatterometry technique to monitor formation of bubbles.

16. The method of claim 15 further comprising modeling optical signatures to determine expected optical signatures at predetermined cell locations.

17. The method of claim 16 further comprising comparing expected optical signatures with actual values for the optical signatures.

18. The method of claim 17 further comprising controlling the immersion lithography in response to the comparing act.

19. The method of claim 10 further comprising dividing a surface of the wafer according to a mesh configuration that corresponds to the grating.

20. A system for immersion lithography comprising:
means for imprinting a pattern on a wafer surface via an immersion fluid; and
means for constraining dynamics of motion for the immersion fluid comprising a grating with a plurality of cell structures that compartmentalizes the immersion fluid to boundaries of the cell structures and mitigates movement and turbulence of the immersion fluid, the grating placed over the wafer surface that undergoes the immersion lithography, each cell structure accommodating a shape of a stepping pattern having a predetermined field size based on circuit design requirements for the wafer.

* * * * *